(12) United States Patent
Dimitrakopoulos et al.

(10) Patent No.: US 7,948,083 B2
(45) Date of Patent: May 24, 2011

(54) RELIABLE BEOL INTEGRATION PROCESS WITH DIRECT CMP OF POROUS SICOH DIELECTRIC

(75) Inventors: Christos D. Dimitrakopoulos, Baldwin Place, NY (US); Stephen M. Gates, Ossining, NY (US); Vincent J. McGahay, Poughkeepsie, NY (US); Sanjay C. Mehta, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/763,135

(22) Filed: Jun. 14, 2007

(65) Prior Publication Data
US 2007/0228570 A1 Oct. 4, 2007

Related U.S. Application Data

(62) Division of application No. 11/063,152, filed on Feb. 22, 2005, now Pat. No. 7,253,105.

(51) Int. Cl.
*H01L 29/40* (2006.01)
(52) U.S. Cl. .. 257/758; 257/759; 257/508; 257/E23.142
(58) Field of Classification Search .......... 257/758–759, 257/508, E23.142
See application file for complete search history.

(56) References Cited

U.S. PATENT DOCUMENTS

| | | | |
|---|---|---|---|
| 6,147,009 A | 11/2000 | Grill et al. | |
| 6,312,793 B1 | 11/2001 | Grill et al. | |
| 6,437,443 B1 * | 8/2002 | Grill et al. | 257/758 |
| 6,441,491 B1 | 8/2002 | Grill et al. | |
| 6,479,110 B2 | 11/2002 | Grill et al. | |
| 6,497,963 B1 | 12/2002 | Grill et al. | |
| 6,541,398 B2 * | 4/2003 | Grill et al. | 438/780 |
| 6,566,278 B1 * | 5/2003 | Harvey et al. | 438/778 |
| 6,768,200 B2 | 7/2004 | Grill et al. | |
| 6,770,573 B2 | 8/2004 | Grill et al. | |
| 2002/0093075 A1 * | 7/2002 | Gates et al. | 257/531 |
| 2003/0057414 A1 * | 3/2003 | Dalton et al. | 257/3 |
| 2004/0018319 A1 * | 1/2004 | Waldfried et al. | 427/508 |
| 2005/0156285 A1 | 7/2005 | Gates et al. | |
| 2005/0276930 A1 | 12/2005 | Gates et al. | |
| 2006/0105567 A1 * | 5/2006 | Ramachandrarao et al. | 438/637 |

* cited by examiner

*Primary Examiner* — Hoai v Pham
*Assistant Examiner* — Elias Ullah
(74) *Attorney, Agent, or Firm* — Scully, Scott, Murphy & Presser, P.C.; Louis J. Percello, Esq.

(57) ABSTRACT

The present invention relates to methods of improving the fabrication of interconnect structures of the single or dual damascene type, in which there is no problem of hard mask retention or of conductivity between the metal lines after fabrication. The methods of the present invention include at least steps of chemical mechanical polishing and UV exposure or chemical repair treatment which steps improve the reliability of the interconnect structure formed. The present invention also relates to an interconnect structure which include a porous ultra low k dielectric of the SiCOH type in which the surface layer thereof has been modified so as to form a gradient layer that has both a density gradient and a C content gradient.

13 Claims, 10 Drawing Sheets

RELIABLE BEOL INTEGRATION PROCESS WITH DIRECT CMP OF POROUS SICOH DIELECTRIC

RELATED APPLICATIONS

This application is a divisional application of U.S. Ser. No. 11/063,152, filed Feb. 22, 2005.

FIELD OF THE INVENTION

The present invention generally relates to integrated circuits (ICs). More particularly, the present invention relates to interconnect structures, including multilevel metal interconnect structures fabricated by damascene methods in which the capacitance and conductivity between metal lines is low. The present invention provides various methods for making improved interconnect structures based on metal damascene wiring having a reduced capacitance and stable, low, conductivity between metal lines, both during IC operation and reliability stress of the IC device.

BACKGROUND OF THE INVENTION

Generally, semiconductor devices include a plurality of circuits, which form an IC fabricated on a single silicon crystal substrate. A complex network of signal paths will normally be routed to connect the circuit elements distributed on the surface of the substrate. Efficient routing of these signals across the device requires the formation of multi-level or multi-layered interconnection schemes, such as, dual damascene wiring structures based on copper or other conductive metals. Copper based interconnects are desirable due to their efficacy in providing high speed signal transmission between large numbers of transistors on a complex semiconductor chip.

Within the interconnect structure, metal vias run perpendicular to the silicon substrate and metal lines run parallel to the silicon substrate. Presently, interconnect structures formed on an integrated circuit chip include at least about 2 to 10 wiring levels fabricated at a minimum lithographic feature size designated about 1× (referred to as "thin wires") and above these levels are about 2 to 6 wiring levels fabricated at a larger size (referred to as "fat wires"). Further enhancement of the signal speed and reduction of interaction of signals in adjacent metal lines (known as "cross-talk") is achieved in the 90 nm node product IC chips by surrounding the metal lines and vias in a low k dielectric having a dielectric constant (k) of about 3 to about 3.5. Future product nodes will use an ultra low k dielectric that has a dielectric constant between 1.8 and 3.

In various prior art structures, the thin wires (and optionally the fat wires) are formed in a low dielectric constant (k) material having a dielectric constant between about 3 and about 3.5. In other prior art structures, thin wires (and optionally the fat wires) are formed in an ultra low dielectric constant (ULK) material having a dielectric constant less than 3 and potentially as low as 1.8. Typically, the ULK materials have dielectric constants within a range from 1.8 to 3.

However, fabrication and reliability problems are associated with these prior art structures. For example, in order to perform chemical mechanical polish (CMP) planarization of the conductive metal, such as copper and a metal liner, a hard mask (HM) layer is used atop the ULK dielectric. The HM provides a layer with a low CMP rate, and prevents contamination of the ULK dielectric with components of the CMP slurry, including water (which reacts to form Si—OH groups in the ULK dielectric) and chemicals that interact with the ULK dielectric.

Two specific problems with porous ultra low k (ULK) dielectric films and integration using a HM layer are capacitance and HM retention; porous ULK dielectrics may be made using a sacrificial porogen phase in which the as deposited film contains 100% of the sacrificial phase, while the cured ULK has essentially all of this phase removed, and contains only a few percent or less of the sacrificial phase. The effective dielectric constant ($k_{eff}$) of the BEOL structure is higher than desired due to the use of the HM layer in the structure. HM retention means ensuring uniform retention of the HM in all structures, despite CMP rates that depend on metal pattern density and despite center-to-edge variability of the polishing rates across the wafer. This could lead to potential HM erosion and polishing into the ULK dielectric, thus directly exposing the ULK dielectric to the CMP slurry. The aforesaid erosion and polishing could adversely impact the overall chip performance by increasing the interline leakage (conductivity) and the capacitance (due to a higher film dielectric constant). Further, the topography (roughness) generated at a lower level could result in other CMP or lithography issues at the subsequent upper level(s) in an integrated multilevel build.

A third problem using porous ULK dielectrics is CMP damage to the HM layer, which may exist in three different forms. The first is added Si—OH groups which raise the k and increase the conductivity of the ULK dielectric. The second is broken bonds which increase conductivity. The third is contamination of the HM with metal ions or other chemicals that also increase conductivity.

A solution to the HM retention problem has been to integrate without a HM layer, which is common with low k dielectrics. Within this approach, the ULK dielectric is exposed to CMP, which can cause the dielectric to have severe electrical problems such as high conductivity and increased k. FIG. 1 shows J vs. E plots (i.e., current density vs. electric field) measured on a blanket ULK dielectric layer exposed to CMP Process A for 60 seconds. CMP Process A is chemical-mechanical in nature, but uses a very low down force (0.8 psi) suitable for integration with porous ultra low k dielectric films. The blanket ULK films of FIG. 1 were exposed to Process A, the details of which are: $H_2O_2$ based commercial liner slurry (Cabot6618), for 60 sec at 0.8 psi down force. Process A causes the dielectric constant to increase from 2.2 to 3.4 (measured at 150° C.). The J vs. E plot shown in FIG. 1 illustrates how Process A increases the conductivity of the porous ULK dielectric films that were deposited by plasma enhanced chemical vapor deposition. In FIG. 1, curves 1A and 1B (same SiCOH dielectric measured at 150° C.) and 2A and 2B (same SiCOH dielectric measured at 23° C.) are measured on a wafer exposed to process A and show high leakage current density (J). Curves 5 (SiCOH dielectric measured at 150° C.) and 6 (SiCOH dielectric measured at 23° C.) also present in FIG. 1 are measured from a control wafer with no CMP exposure and show low J.

As is known in the art, some of this electrical damage may be repaired using a thermal anneal process step. FIG. 2 illustrates a known prior art method to repair the CMP damage using a thermal (e.g., furnace) anneal. While the physisorbed water can be easily removed by low temperature annealing, the chemisorbed water (which forms Si—OH groups) would require extended high temperature annealing.

Specifically, FIG. 2 shows J vs. E plots (current density vs. electric field) measured on the same ULK dielectric (blanket) films used in FIG. 1. The blanket film was exposed to CMP Process B, the details of which are: a commercial liner slurry, with 6 psi down force, and 15 sec contact time. The CMP Process B exposure results in an increased leakage, line 21, and a dielectric constant of 2.6. Pieces of the wafer were annealed at temperatures of 350° C., 375° C. and 400° C. for 6 minutes. The J vs. E plot after CMP Process B is line 21, with highest leakage current. The J vs. E plot after CMP Process B and then annealing at 350° C. is line 22, after annealing at 375° C. is line 23, and after a 400° C. anneal is line 24. The film leakage is reduced in lines 22-24, but never reaches the original value for a control (no CMP exposure) film, which is illustrated by line 25.

A different fabrication and reliability problem associated with these prior art structures occurs during deposition of the copper barrier/etch stop layer deposited on the copper lines (referred herein as 'the Cu cap'). A plasma pre-clean for the Cu cap (PPFCC) step is used in-situ immediately prior to depositing the Cu cap, in order to provide strong adhesion of the Cu cap to the Cu lines and hence to provide resistance to a common failure mode: electromigration. This plasma pre-clean enhances cap adhesion to copper, but induces damage to the HM or the ULK dielectric. This plasma damage may be in at least 3 forms. The first is nitrogen implantation (when $NH_3$ or $N_2/NH_3$ plasmas are used) which raises the dielectric constant (capacitance) between the metal lines. The second is broken bonds which increase the conductivity between the metal lines. The third is removal of carbon from the HM or the ULK, which raises k and increases conductivity.

FIG. 3 shows an increase in leakage current for a HM film having a SiCOH composition after the HM film was exposed to the $NH_3$ PPFCC. Specifically, FIG. 3 shows J vs. E plots (current density vs. electric field) measured on the same ULK dielectric (blanket) films used in FIGS. 1 and 2. Line 31 is the J vs. E plot from the control wafer (no plasma exposure) and lines 32 are measured after exposure to the plasma pre-clean (PPFCC).

Use of ultraviolet (UV) light to modify the bulk of a SiCOH dielectric film is well known. As is known in the art, UV radiation may be used to penetrate into a dielectric of the SiCOH composition to strengthen the bulk of the dielectric to raise the elastic modulus. For example, U.S. Pat. No. 6,566,278 to Harvey teaches the use of UV light to make the bulk of a SiCOH film denser. Specifically, the '278 patent teaches the conversion of Si—OH groups in the bulk of the film into Si—O—Si linkages. The resulting film disclosed in the '278 patent has "bonds characteristic of an ordered silicon oxide lattice" after UV irradiation. To accomplish this, the UV radiation breaks Si—O and O—H bonds and causes formation of more $Si(O)_3$ and $Si(O)_4$ structures (with 3 or 4 bonds to Si, respectively) and these render the material stronger and with a higher elastic modulus.

FIG. 4 shows the absorbance vs. wavelength spectrum of two prior art ULK SiCOH dielectrics. Curve 42 is measured from the ULK dielectric film used in FIGS. 1, 2, 3. Curve 41 is measured from a different ULK dielectric film prepared by a similar process. It is seen that absorbance is higher the shorter the wavelength.

In view of the above, there is a need for providing methods that ensure the successful integration of BEOL structures without a HM/CMP stop layer being present in the structure.

SUMMARY OF THE INVENTION

The present invention relates to methods of improving the fabrication of BEOL interconnect structures of the single or dual damascene type, in which there is no problem of HM retention or of conductivity between the metal lines after fabrication.

The present invention also relates to methods of improving the fabrication of BEOL interconnect structures of the single or dual damascene type, in which a HM is not used, and in which the CMP-induced damage to ULK dielectrics is repaired to make dielectrics with high reliability.

The present invention further relates to the repair of the plasma damage caused by a PPFCC step to the ULK dielectric, again to improve the reliability of the structure. The present invention even further relates to methods for improving the fabrication of BEOL interconnect structures of the single or dual damascene type in which paths for increased conductivity between the metal lines are eliminated. The elimination of such high conductivity paths results in a highly reliable structure.

The present invention yet further relates to methods for improving the fabrication of BEOL interconnect structures of the single or dual damascene type in which the plasma damage on the top of the ULK dielectric is minimal due to a thin, dense, highly crosslinked, oxide-like surface layer that is formed on the ULK dielectric.

Broadly speaking, the present invention provides various methods in which the damage caused by CMP and PPFCC steps can be repaired during the fabrication of the structure itself, not by using a post anneal step. In particular, the applicants of the present application have unexpectedly found that the damaged caused by CMP and PPFCC can be repaired using a combination of CMP exposure plus a subsequent high temperature UV exposure. More particularly, the applicants have surprisingly discovered that the aforementioned combination of CMP exposure and UV exposure actually changes the Si—O bonding of an ULK dielectric in such a way that improved electrical properties can be achieved.

In a first embodiment of the present invention a method of fabricating a BEOL interconnect structure including a porous ULK dielectric, without a HM layer is provided. This embodiment of the present invention comprises the steps of:

providing a structure comprising a porous ULK dielectric on a substrate, said porous ULK dielectric having at least one opening located therein;

filling said at least one opening with at least a conductive material;

planarizing at least said conductive material utilizing a CMP slurry to provide a planarized structure having an upper surface of said conductive material that is substantially coplanar with an upper surface of said ULK dielectric, said ULK dielectric is exposed to said CMP slurry;

exposing said planarized structure to UV radiation at a temperature from about 200° to about 450° C.;

subjecting said planarized structure to a plasma preclean process; and forming a capping layer on at least said conductive material.

The above steps can be repeated any number of times, e.g., from 2 to 10, to provide a multilevel interconnect structure. Following the formation of uppermost capping layer, the structure can be subjected to conventional damascene processing steps to complete the fabrication of the interconnect structure.

In addition to the first embodiment described above, the present invention also provides a second embodiment which is similar to the first embodiment except that the step of exposing the planarized structure to UV radiation is replaced by a step of exposing said planarized structure to a chemical repair step. For example, the chemical repair step may include silylation.

A third embodiment is also provided in which the processing steps described in the first embodiment are used in conjunction with a second UV exposure step that is performed after formation of the capping layer. The second UV exposure step repairs damage that may arise during the plasma precleaning processing step.

It is noted that the various embodiments described above provide an interconnect structure wherein the reliability of the porous ULK dielectric is improved.

In addition to the various methods described above, the present invention also provides an interconnect structure that includes a porous ULK dielectric having a gradient surface layer. In accordance with the present invention, the gradient surface layer of the ULK dielectric, which is formed during the UV exposure step, is a thin layer having a thickness from about 1 to about 50 nm, and is both a density gradient and a C content gradient. As a result of the density and C content gradient, the inventive interconnect structure is more reliable and has a lower conductivity between the conductive lines than the interconnect structures of the prior art.

DETAILED DESCRIPTION OF THE INVENTION

Figure 1:
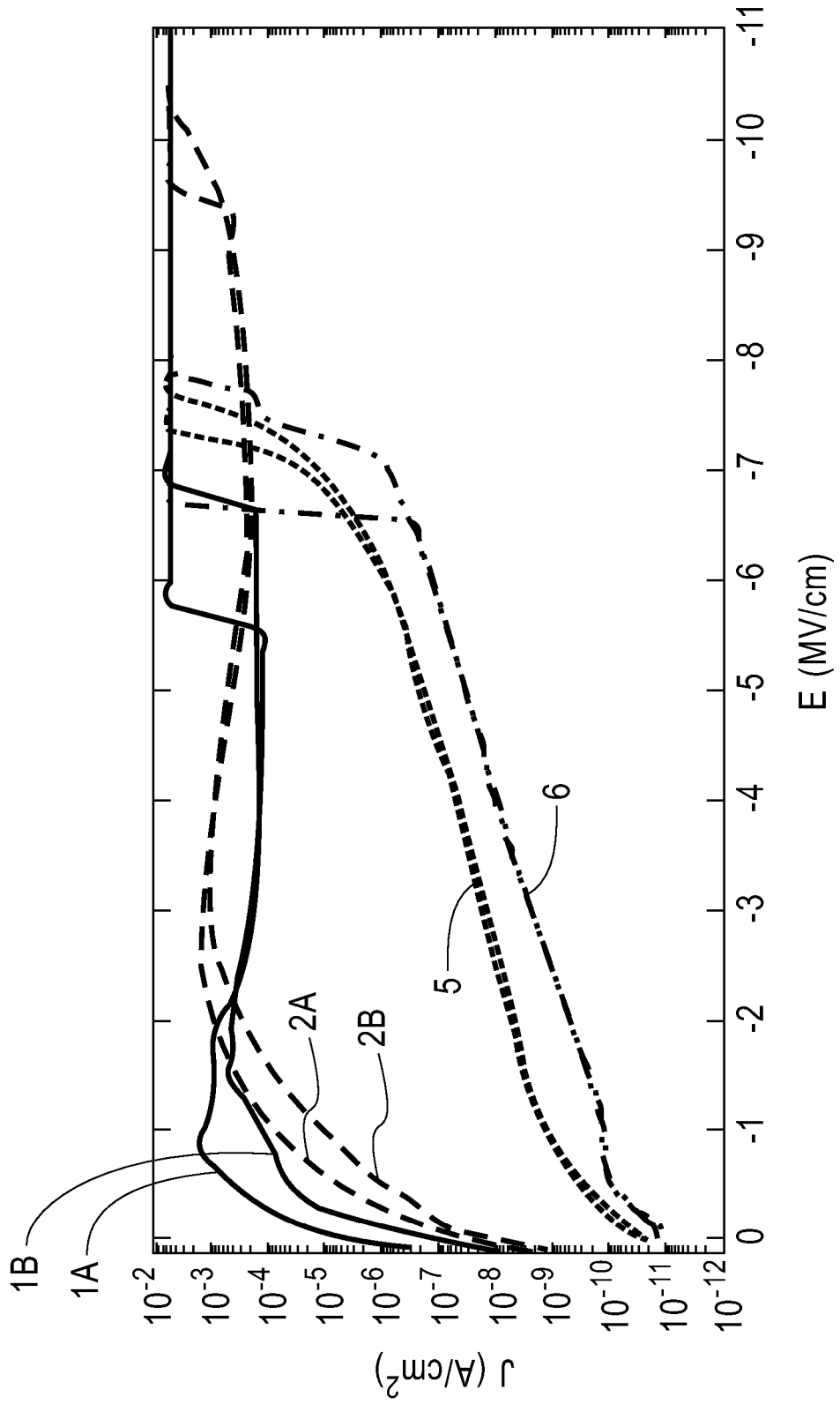
FIG. 1 is electrical data measured from prior art ULK dielectrics exposed to CMP Process A showing the effect of the CMP process on J vs. E plots.
Figure 2:
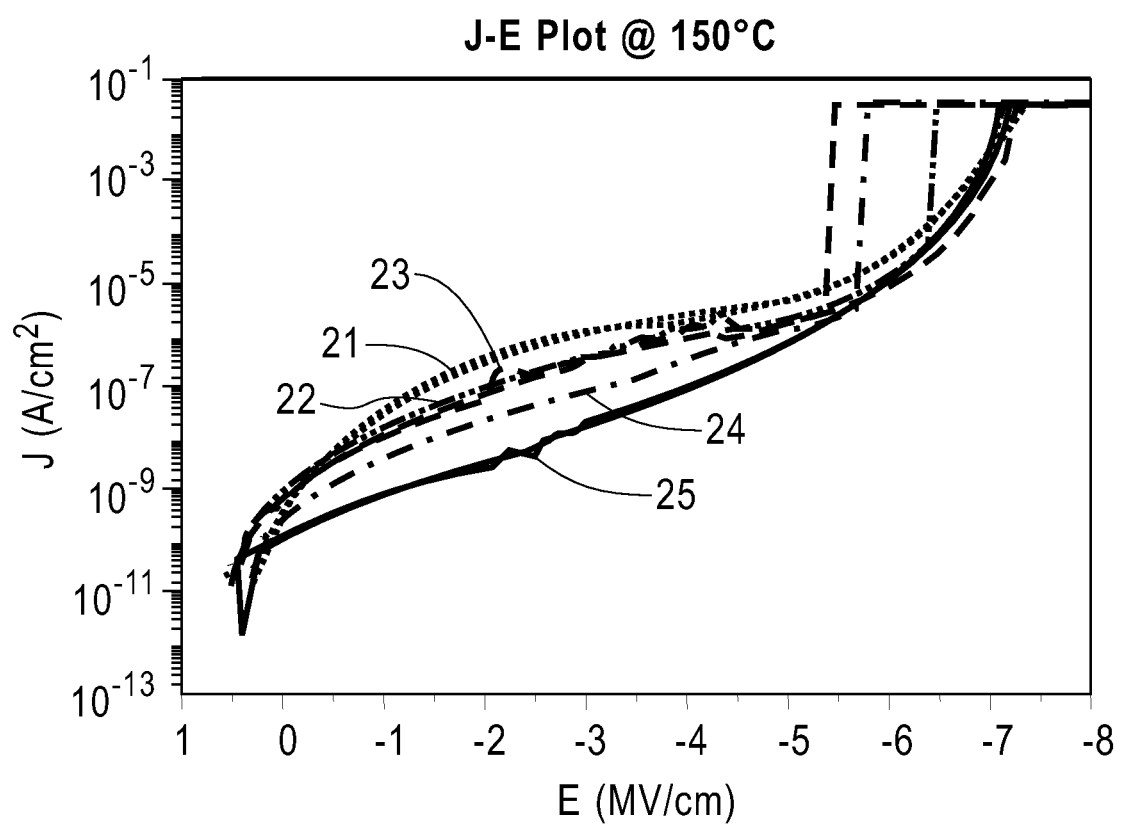
FIG. 2 is electrical data measured from prior art ULK dielectrics exposed to CMP Process B showing the effect of a thermal treatment step at different temperatures which is used in the prior art to repair CMP damage.
Figure 3:
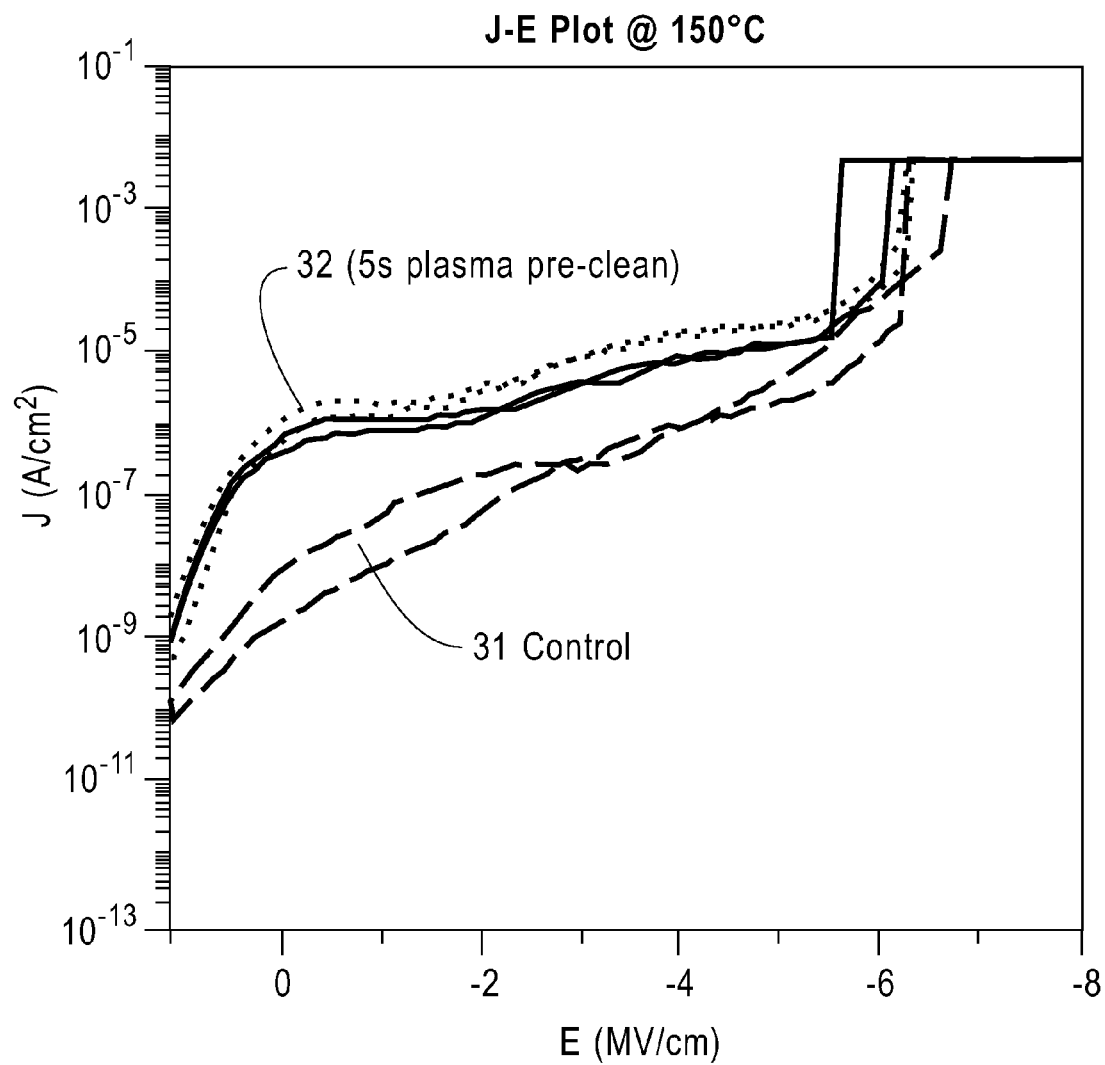
FIG. 3 is electrical data measured from prior art ULK dielectrics exposed to a plasma process showing the effect of the plasma on the J. vs. E plots. A control wafer is also shown for comparison.
Figure 4:
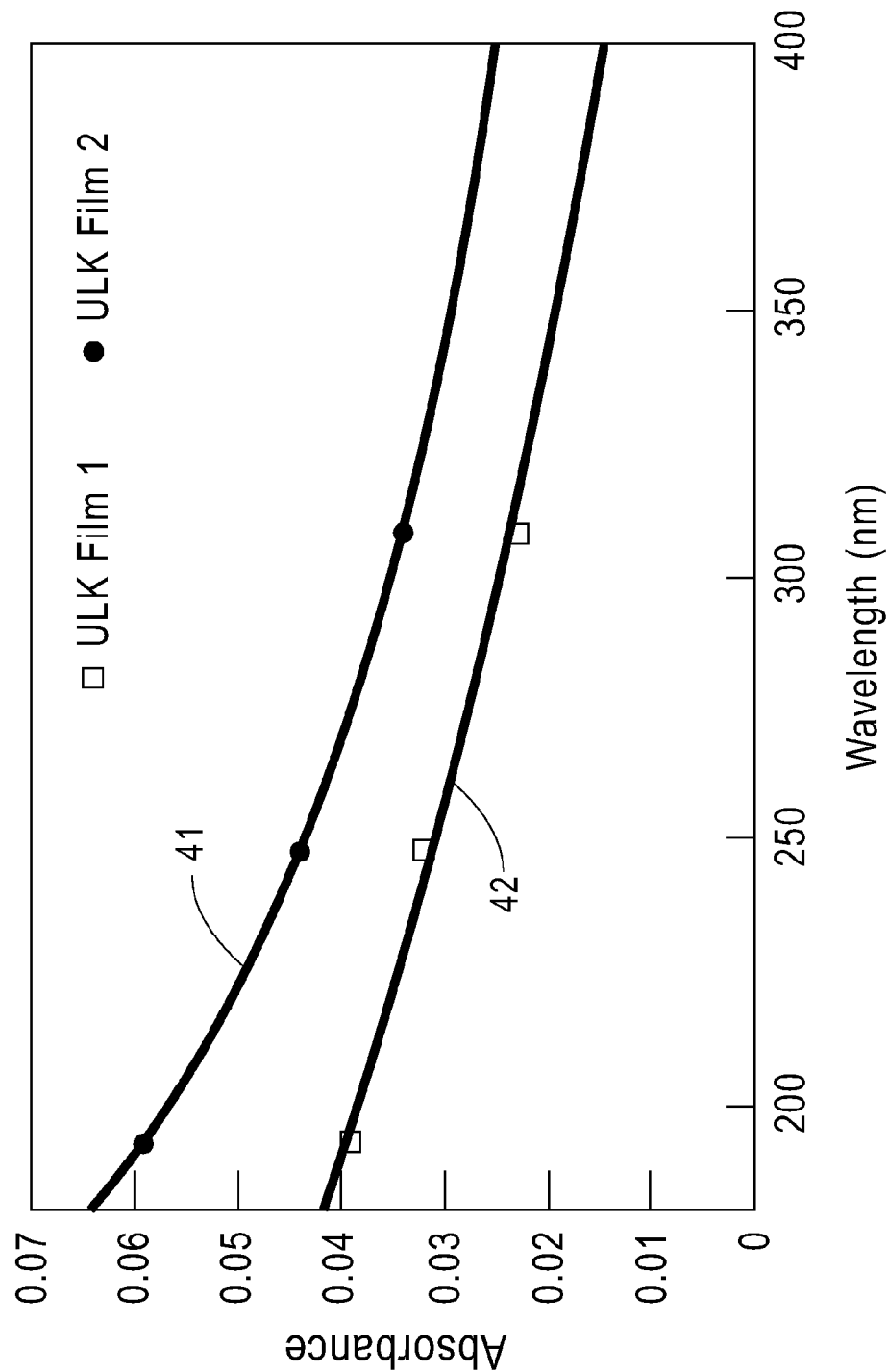
FIG. 4 is two UV absorption spectra (absorbance vs. wavelength) from the ULK dielectric material used in FIGS. 1, 2 and 3 and from a second similar process.

The present invention, which provides methods of fabricating a reliable interconnect structure as well as the interconnect structure formed by said methods, will now be described in greater detail. It should be noted that the structures shown in the drawings are provided for illustrative purposes and thus the same are not drawn to scale.

First Embodiment

Reference is made to FIGS. 5A-5E which illustrate the processing steps of the first embodiment of the present invention for fabricating a reliable BEOL interconnect structure. Specifically, FIGS. 5A-5E shows cross sectional views of the interconnect structure through the various processing steps.

Figure 5A:
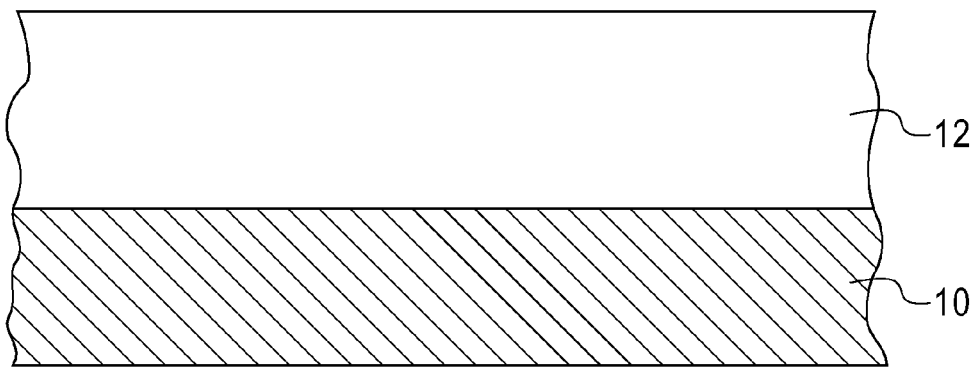
FIGS. 5A-5E are pictorial representations (through cross sectional views) illustrating a basic interconnect structure through the processing steps of the first embodiment of the present invention.

The first embodiment of the present invention, as shown in FIG. 5A, begins by first forming a ULK dielectric material 12 on a surface of a substrate 10. The term 'substrate' is used in the present application to include a semiconducting material, an insulating material, a conductive material or any combination thereof, including multilayered structures. Thus, for example, substrate 10 can be a semiconducting material such as Si, SiGe, SiGeC, SiC, GaAs, InAs, InP and other III/V or II/VI compound semiconductors. The semiconductor substrate 10 can also include a layered substrate such as, for example, Si/SiGe, Si/SiC, silicon-on-insulators (SOIs) or silicon germanium-on-insulators (SGOIs).

When substrate 10 is an insulating material, the insulating material can be an organic insulator, an inorganic insulator or a combination thereof including multilayers. When the substrate 10 is a conductive material, the substrate 10 may include, for example, polySi, an elemental metal, alloys of elemental metals, a metal silicide, a metal nitride and combinations thereof, including multilayers.

In some embodiments, the substrate 10 includes a combination of a semiconducting material and an insulating material, a combination of a semiconducting material and a conductive material or a combination of a semiconducting material, an insulating material and a conductive material.

When the substrate 10 comprises a semiconductor material, one or more semiconductor devices such as complementary metal oxide semiconductor (CMOS) devices can be fabricated thereon. For clarity, the one or more semiconductor devices are not shown in the drawings of the present application.

The ULK dielectric 12 comprises a porous dielectric having a dielectric constant of less than 3, preferably from 1.8 to 3. The ULK dielectric 12 is comprised of atoms of Si, C, O, and H and is sometimes referred to in the art as a carbon doped oxide or an organosilicate glass. In the present invention, the dielectrics comprising atoms of Si, C, O and H are referred to as SiCOH dielectrics. The SiCOH dielectric used as ULK 12 is formed utilizing conventional processes such as disclosed, for example, in U.S. Pat. Nos. 6,147,009, 6,312,793, 6,437, 443, 6,441,491, 6,541,398, 6,479,110 B2, and 6,497,963, as well as U.S. patent application Ser. No. 10/174,749, filed Jun. 19, 2002, Ser. No. 10/340,000, filed Jan. 23, 2003 and Ser. No. 10/390,801, filed Mar. 18, 2003, the entire contents of each of the aforementioned U.S. Patents and Patent Applications are incorporated herein by reference.

Typically, the ULK dielectric 12 is formed using plasma enhanced chemical vapor deposition (PECVD). In addition to PECVD, the present invention also contemplates that the ULK dielectric 12 can be formed utilizing chemical vapor deposition (CVD), high-density plasma (HDP) deposition, pulsed PECVD, spin-on application, or other related methods. The thickness of the ULK dielectric 12 deposited may vary; typical ranges for the deposited ULK dielectric 12 are from about 50 nm to about 1 µm, with a thickness from 100 to about 500 nm being more typical.

Specifically, the SiCOH dielectric 12 is formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming a SiCOH dielectric material. The present invention yet further provides for mixing the first precursor with an oxidizing agent such as $O_2$, $CO_2$ or a combination thereof, thereby stabilizing the reactants in the reactor and improving the uniformity of the ULK dielectric 12 deposited on the substrate 10.

In addition to the first precursor, a second precursor (gas, liquid or vapor) comprising atoms of C, H, and optionally O, F and N can be used. Optionally, a third precursor (gas, liquid or gas) comprising Ge may also be used.

Preferably, the first precursor is selected from organic molecules with ring structures comprising SiCOH components such as 1,3,5,7-tetramethylcyclotetrasiloxane ("TMCTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), and related cyclic and non-cyclic silanes, siloxanes and the like.

The second precursor that may be used in forming a SiCOH dielectric is a hydrocarbon molecule. Although any hydrocarbon molecule such as, for example, ethylene, may be used, preferably the second precursor is selected from the group consisting of hydrocarbon molecules with C=C double bonds and with ring structures, preferably with more than one ring present in the molecule or with branched chains attached to the ring. Also useful are molecules containing branched tertiary butyl (t-butyl) and isopropyl (i-propyl) groups attached to a hydrocarbon ring; the ring may be saturated or unsaturated (containing C=C double bonds). The third precursor may be formed from germane hydride or any other reactant comprising a source Ge.

In a preferred embodiment of the present invention, the SiCOH dielectric, which is used as the ULK dielectric 12, may be deposited using a method the includes the step of providing a parallel plate reactor, which has a conductive area of a substrate chuck between about 85 cm$^2$ and about 750 cm$^2$, and a gap between the substrate and a top electrode between about 1 cm and about 12 cm. A high frequency RF power is applied to one of the electrodes at a frequency between about 0.45 MHz and about 200 MHz. Optionally, an additional low frequency power can be applied to one of the electrodes. When an additional low frequency power is applied to one of the electrodes, it is applied at a frequency between about 10 KHz and about 13.6 MHz.

The conditions used for the deposition step may vary depending on the desired final dielectric constant of the SiCOH dielectric. Broadly, the conditions used for providing a stable dielectric material comprising elements of Si, C, O and H that has a dielectric constant of about 3.0 or less include: setting the substrate temperature at between about 200° C. and about 425° C.; setting the high frequency RF power density at between about 0.1 W/cm$^2$ and about 2.5 W/cm$^2$; setting the first liquid precursor flow rate at between about 100 mg/min and about 5000 mg/min, optionally setting the second liquid precursor flow rate at between about 50 mg/min to about 10,000 mg/min; optionally setting the third liquid precursor flow rate at between about 25 mg/min to about 4000 mg/min; optionally setting the inert carrier gases such as helium (and/or argon) flow rate at between about 50 sccm to about 5000 sccm; setting the reactor pressure at a pressure between about 1000 mTorr and about 7000 mTorr; and setting the high frequency RF power between about 75 W and about 1000 W. Optionally, a low frequency power may be added to the plasma between about 30 W and about 400 W. When the conductive area of the substrate chuck is changed by a factor of X, the RF power applied to the substrate chuck is also changed by a factor of X.

When an oxidizing agent is employed in the present invention, it is provided into the PECVD reactor at a flow rate between about 10 sccm to about 1000 sccm.

While liquid precursors are used in the above example, it is known in the art that the organosilicon gas phase precursors (such as trimethylsilane) can also be used for the deposition. A porogen is typically included during the deposition of the ULK dielectric 12 that causes subsequent pore formation within the film 12 during a subsequent curing step. In the present invention, the subsequent curing is well known to those skilled in the art, and may be a thermal process or a thermal process combined with intense UV radiation in a UV cure processing tool. The subsequent curing step may remove all the porogen from the ULK dielectric or a small percentage of the porogen (on the order of about 50% or less, preferably 5%) may remain in the ULK dielectric 12. The ULK dielectric 12 having some porogen remaining after curing has improved hydrophobicity and good mechanical strength. Moreover, when such a ULK dielectric having some porogen therein is subjected to the UV exposure step (to be described in greater detail herein below) the porogen remaining in the film can terminate dangling bonds and further improve electrical properties. A typical curing process that can be used in the present invention comprises placing the substrate containing the ULK dielectric in a UV cure processing tool on a hot stage at a temperature from about 350° to 425° C., with about 400° C. being preferred, and exposing the dielectric to intense UV radiation for a period sufficient to cure the dielectric.

The ULK dielectric 12 formed at this point of the present invention contains a matrix of a hydrogenated oxidized silicon carbon material (SiCOH) comprising atoms of Si, C, O and H in a covalently bonded tri-dimensional network and having a dielectric constant of not more than about 3.0. The tri-bonded network may include a covalently bonded tri-dimensional ring structure comprising Si—O, Si—C, Si—H, C—H and C—C bonds.

The ULK dielectric 12 may comprise F and N and may optionally have the Si atoms partially substituted by Ge atoms. The ULK dielectric 12 typically contains molecular scale voids (i.e., nanometer-sized pores) of between about 0.3 to about 50 nanometers in diameter, and most preferably between about 0.4 and about 10 nanometers in diameter. The nanometer-sized pores of the ULK dielectric film 12 occupy a volume of between about 0.5% and about 50% of a volume of the material.

The SiCOH dielectric used as the ULK dielectric 12 typically comprises between about 5 and about 40 atomic percent of Si; between about 5 and about 45 atomic percent of C; between 0 and about 50 atomic percent of O; and between about 10 and about 55 atomic percent of H.

Figure 5B:
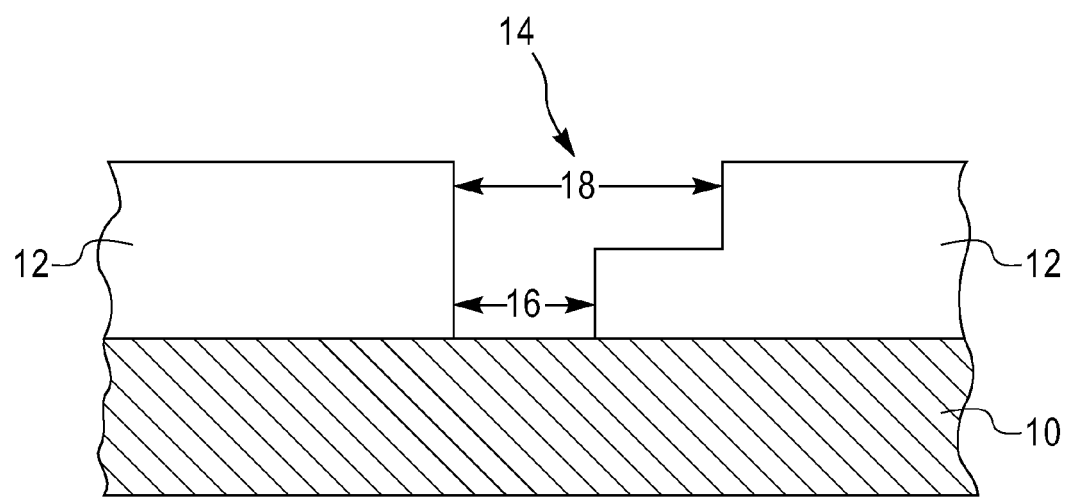

Next, and as shown in FIG. 5B, at least one patterned opening 14 is formed into the ULK dielectric 12 by lithography and etching using a conventional single or dual damascene process. The lithographic step includes applying at least a photoresist and optionally a hard mask (not shown) to the surface of the ULK dielectric 12, exposing the applied photoresist to a desired pattern of radiation (via or line, typically via), and developing the exposed resist using a conventional resist developer. The etching step used to form the pattern into the ULK dielectric 12 (and the hard mask if used) includes a dry etching process such as, for example, reactive ion etching (RIE), plasma etching or ion etching. The above procedure can be repeated to form a line or via pattern, typically a line pattern into the ULK dielectric 12. In FIG. 5B, the at least one opening 14 includes a via 16 and a line 18.

Figure 5C:
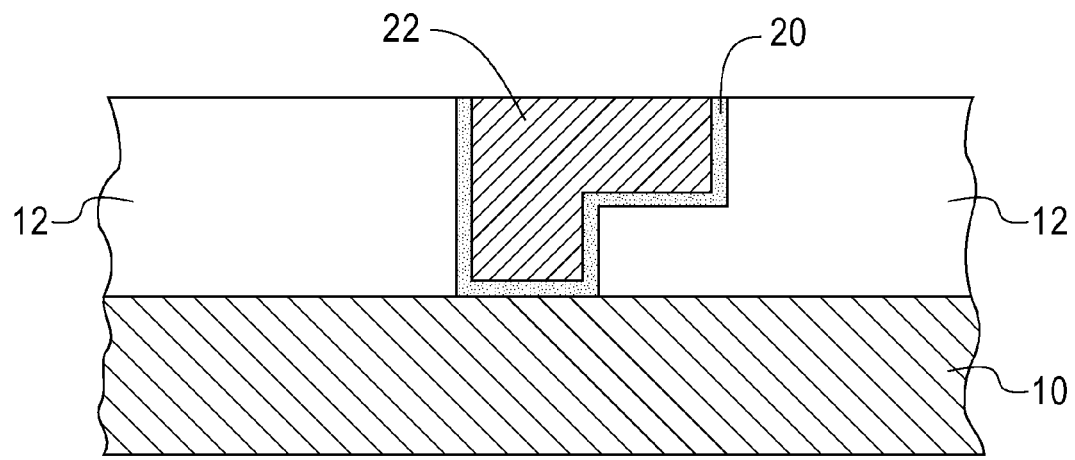

FIG. 5C illustrates the structure after filling the at least one opening 14 with a liner 20 and then with a conductive material 22. The liner 20, which includes one or more liner materials, is formed on all exposed surfaces (vertical and horizontal) within the opening 14. The liner 20 is formed by any deposition process including, but not limited to: CVD, PECVD, sputtering, chemical solution deposition or plating. The liner 20 is comprised of any material that can serve as a barrier to prevent a conductive material from diffusing there through. Illustrative examples of such barrier materials that can be used as liner 20 include a refractory metal, such as Ta, Ti, W, Ru, or nitrides thereof, e.g., TaN, TiN, or WN. The liner 20 may also comprise TiNSi. The thickness of the liner 20 is typically from about 5 to about 60 nm, with a thickness from about 10 to about 40 nm being more typical.

In some embodiments, not shown, it is possible to remove the liner 20 from the bottom wall of the via 16 to provide an interconnect structure having an open via bottom. When an open via bottom structure is desired, an ion bombardment or other like directional etching process is employed.

Next, a conductive material 22 is deposited within the opening 14. The conductive material 22 comprises polySi, a conductive metal, an alloy comprising at least one conductive metal, a conductive metal silicide or combinations thereof. Preferably, the conductive material 22 is a conductive metal such as Cu, W, or Al. In one highly preferred embodiment, the conductive material 22 is comprised of Cu. When Cu is employed as the conductive material 22, it is highly preferred to utilize a Ta-based liner. The conductive material 22 is formed within the opening 14 utilizing a conventional deposition process including, but not limited to: CVD, PECVD, sputtering, chemical solution deposition or plating. After deposition, a conventional chemical mechanical polishing (CMP) technique including CMP Process A and B described above, is employed such that the upper surface of the conductive material 22 is substantially coplanar with the upper surface of the ULK dielectric 12. The conductively filled opening can be referred to herein as a conductive feature that is embedded within the ULK dielectric 12.

It is noted that the CMP process used in the present invention includes a conventional CMP slurry that is capable of removing the deposited conductive material and liner providing the structure shown in FIG. 5C. During the CMP process, an upper surface of the ULK dielectric 12 is exposed to the CMP slurry since no hard mask, as typically used, is employed in the present invention.

It is noted that the CMP process causes a slight increase in the dielectric constant of the ULK dielectric 12 which will be lowered by the subsequent UV exposure step. The slight increase in the dielectric constant is a result of new Si—OH groups being formed in the ULK dielectric 12. Also, the leakage current of the CMP processed ULK dielectric 12 is high (on the order of about 10E-6 A/cm$^2$ or greater) and the breakdown field is low (on the order of about 2 MV/cm or less).

After planarization by CMP, the structure shown in FIG. 5C is positioned within a reactor chamber of a conventional UV cure tool and the structure is then subjected to a UV exposure step at a substrate temperature from about 200° to about 450° C. preferably 400° C. The UV exposure step is performed utilizing a source that can generate light having a wavelength from about 150 to about 500 nm, preferably from about 190 to about 250 nm, to irradiate the surface, especially the exposed surface of the ULK dielectric 12. The UV exposure step is performed for a time period from about 0.5 to about 100 minutes. The UV exposure may be performed in the presence of an ambient gas such as an inert gas including, for example, He, Ar, Xe, $N_2$ or a mixture thereof such as a forming gas $N_2/O_2$. Optionally, a chemically active gas may be added to the inert gas. Examples of chemically active gases that can optionally be used in the present invention include: $H_2$, $CH_4$, trimethylsilane, ethylene or silane derivatives having the formula $HSiRR_1R_2$ wherein R, $R_1$ and $R_2$ may be the same or different and are selected from group consisting of methyl, ethyl, propyl, vinyl, allyl, methoxy and ethoxy.

During the UV exposure step, a gradient layer 12A forms within the upper surface of the ULK dielectric 12. See, FIG. 5D. The gradient layer 12A is a thin oxide-like layer whose thickness is determined by the conditions of the above mentioned UV exposure step. Typically, the gradient layer 12A has a thickness from about 1 to about 50 nm, with a thickness from about 1 to about 10 nm being more typical. The gradient layer 12A has both a density gradient and a C content gradient that differs from the underlying ULK dielectric. Typically, the density of the gradient layer 12A is from about 1.0 to about 1.5 g/cm$^3$ (the ULK dielectric density) to a higher density, with about 2.2 g/cm$^3$ being the upper limit, and with the highest density at the top surface. For example, a ULK SiCOH film with a density of about 1.3 g/cm$^3$ would form a density gradient with a low end from about 1.3 g/cm$^3$ and a high end (at the surface) of about 2 g/cm$^3$. The C content gradient can take different forms (C profiles) within the invention. The most extreme gradient is from about 15 to 20 to about 0%, with the lowest C content at the top surface. Gradients in carbon on the order of 15-20% down to about 5% may be used within the invention.

It is noted that the combination of CMP exposure and UV exposure of the ULK dielectric 12 provided an unexpected result. As indicated above, the CMP processed ULK dielectric 12 has a high leakage current and a low breakdown field. After exposing the CMP processed ULK dielectric 12 to UV exposure as described above the electrical leakage is lowered and a higher breakdown field for the dielectric 12 is obtained. The CMP processed and UV exposed ULK dielectric has an electrical leakage in the field range from 1 to 2 MV/cm of less than about 1E-7 A/cm$^2$, with a range between 1E-9 to 1E-8 A/cm$^2$ being more typical. The CMP processed and UV exposed ULK dielectric has a breakdown field of about 5 MV/cm or greater, with a range between 5 to 7 MV/cm being typical. Also, the CMP process and UV exposed ULK dielectric has a dielectric constant that is lower than that of the CMP process film itself.

As indicated above, the UV exposure step, forms a top skin layer (i.e., the gradient layer 12A) within the ULK dielectric, without the need for making the bulk of the film oxide-like or dense. Typically, the density of the gradient layer 12A is from about 1.0 to about 1.5 g/cm$^3$ (the ULK dielectric density) to a higher density, with about 2.2 g/cm$^3$ being the upper limit, and with the highest density at the top surface. The presence of the gradient layer 12A reduces the capacitance and conductivity between the conductive lines of the interconnect structure. Also, the presence of the gradient layer 12A prevents the ULK dielectric 12 from being damaged by a subsequent preclean process.

Figure 5D:
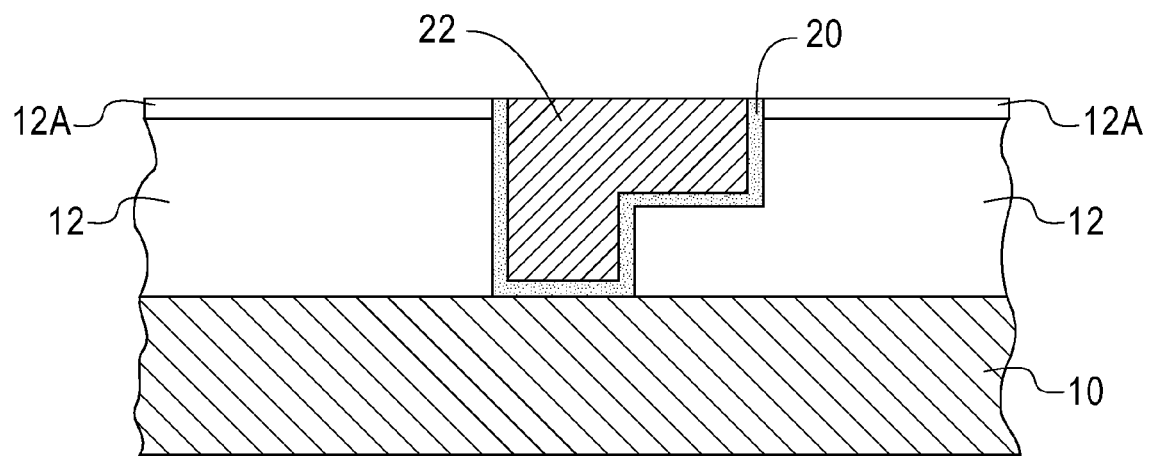

After UV exposure, the structure shown in FIG. 5D is removed from the UV tool and is then placed in a reactor chamber such as a PECVD reactor in which the subsequent capping layer is formed. Prior to forming the capping layer, the structure is subjected to a plasma preclean step (PPFCC). The PPFCC step is performed at a substrate temperature from about 350° C. to about 450° C. for a time period of about 5 seconds to about 60 seconds, with 5 to 20 seconds being preferred. The PPFCC is performed in the presence of a nitrogen and hydrogen-containing plasma such as a plasma of $NH_3$ or $N_2/NH_3$ or $He/NH_3$, or $H_2/N_2$.

Figure 5E:
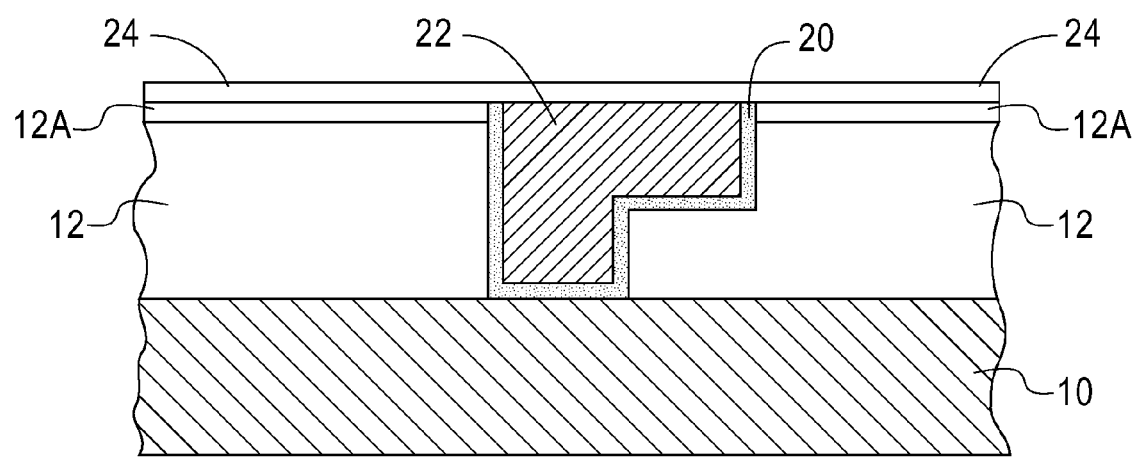

After subjecting the structure to a PPFCC step, a capping layer 24 is formed atop at least a portion of the conductive material 22 utilizing a conventional deposition process such as, for example, chemical vapor deposition, PECVD, evaporation, chemical solution deposition and other like deposition processes. The structure including a blanket capping layer 24 is shown in FIG. 5E. The capping layer 24 is comprised of material that can prevent electromigration in the Cu structures Illustrative, the capping layer 24 may comprise SiN, SiCN, SiNH, SiCNH and other like amorphous materials. The capping layer 24 has a thickness that is typically from about 20 to about 100 nm, with a thickness from about 30 to about 50 nm being even more typical.

The processing steps described above in FIGS. 5A-5E may be repeating any number of times to form the next and subsequent metal levels of the interconnect structure. Although the interconnect structure is not limited to any number of metal levels, current technologies typically contain from 2 to 10 metal levels.

Second Embodiment

In addition to the embodiment described above and illustrated in FIGS. 5A-5E, the present invention also contemplates a second embodiment in which the UV exposure step described in the first embodiment is replaced with a step of exposing the CMP processed ULK dielectric 12 shown in FIG. 5C to a chemical repair step including, for example, silylation. When silylation is employed a compound that is capable of silylating the CMP processed ULK dielectric such as a silane is employed. In this embodiment, gradient layer 12A is a hydrophobic surface such as a silylating surface that reacts with the Si—O groups formed during CMP. The hydrophobic surface can be formed by spin-on coating or a supercritical $CO_2$ tool.

Third Embodiment

The present invention also provides a third embodiment which is similar to the first embodiment except that an additional UV exposure step is performed though the capping layer 24. Hence, in the third embodiment of the present invention, the structure shown in FIG. 5E is first provided as described above in the first embodiment, and then an additional UV exposure step using the same or different conditions as the UV exposure step in the first embodiment is employed. Note that the UV exposure process used in this embodiment must penetrate through the capping layer 24. In this embodiment, any plasma damage caused by the PPFCC step is repaired.

Of the various embodiments mentioned above, the first and third embodiments are preferred. Although the first and third are preferred over the second, each of the three embodiments provides an interconnect structure that is more reliable and has a lower conductivity between conductive layers, e.g., Cu lines, than the interconnect structures of the prior art.

The following example is given to illustrate some advantages of the present invention.

Example

Figure 6:
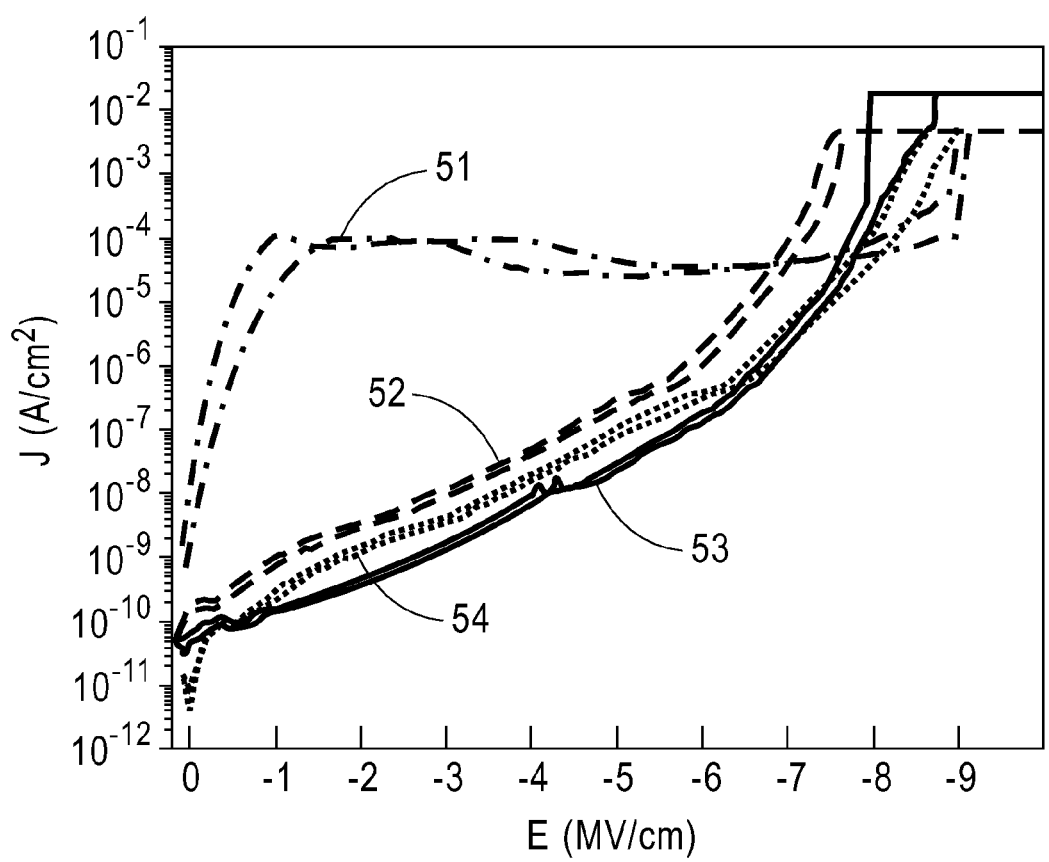
FIG. 6 is electrical data (J vs. E) showing the results using the of the present invention, i.e., CMP exposure and UV exposure to repair CMP damage.

As stated above, an unexpected result has been observed from the combination of CMP exposure and then UV exposure. Referring to FIG. 6, J vs. E curves (electrical data at 23° C.) are shown for exposure of an SiCOH ULK dielectric to CMP Process A in lines 51 (Control Sample), similar to the data of FIG. 1. The leakage current for this sample was high. Also, in FIG. 6, J vs. E curves are shown in lines 52, 53, and 54 for exposure of the SiCOH ULK dielectric to CMP and then to different UV exposure. Lines 52 were generated using CMP exposure and then a UV exposure at 400° C. for 4 minutes using a high intensity UV lamp (designated from now on as lamp 2) in a forming gas (mixture of $N_2$ and $H_2$). Line 53 was generated using CMP exposure and then a UV exposure at, 400° C. for 9 minutes using a lower intensity UV lamp (designated from now on as lamp 1) in a noble gas. Line 54 was generated using CMP exposure and a UV exposure at 400° C. for 4 minutes using UV lamp 2 in a noble gas. The combination of CMP exposure and UV exposure (400° C.) resulted in lower electrical leakage (improved J-E curves shown as 52, 53, 54) and a higher breakdown field for the ULK dielectric. Table 1 (provided herein below) shows the measured dielectric constant data for the same samples as FIG. 6. It is seen in this table that CMP exposure raised the dielectric constant to 2.9, and then the UV exposure lowered the dielectric constant to the range 2.3-2.5.

TABLE 1

| Condition | Dielectric Constant measured at 150° C. |
| --- | --- |
| Exposure to CMP Process A | 2.9 |
| Exposure to CMP Process A and then exposed in a UV tool at 400° C. for 9 minutes using UV lamp 1 in a noble gas | 2.4 |
| Exposure to CMP Process A and then exposed in a UV tool at 400° C. for 4 minutes using UV lamp 2 in a forming gas (mixture of $N_2$ and $H_2$) | 2.3 |
| Exposure to CMP Process A and then exposed in a UV tool at 400° C. for 4 minutes using UV lamp 2 in a noble gas | 2.5 |

Figure 7:
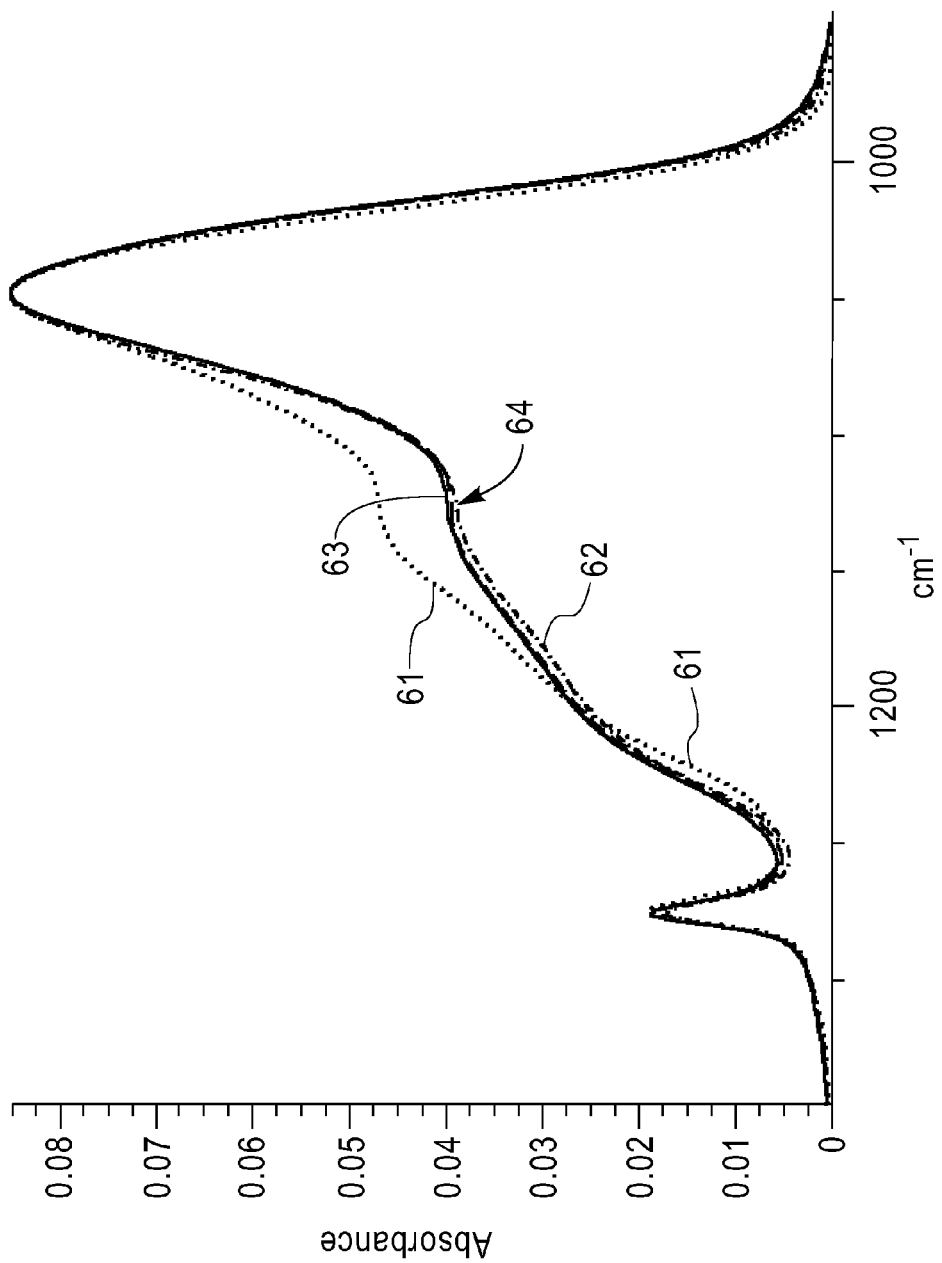
FIG. 7 shows FTIR spectrum of various ULK dielectric materials that were subjected to the inventive method.
Figure 8:
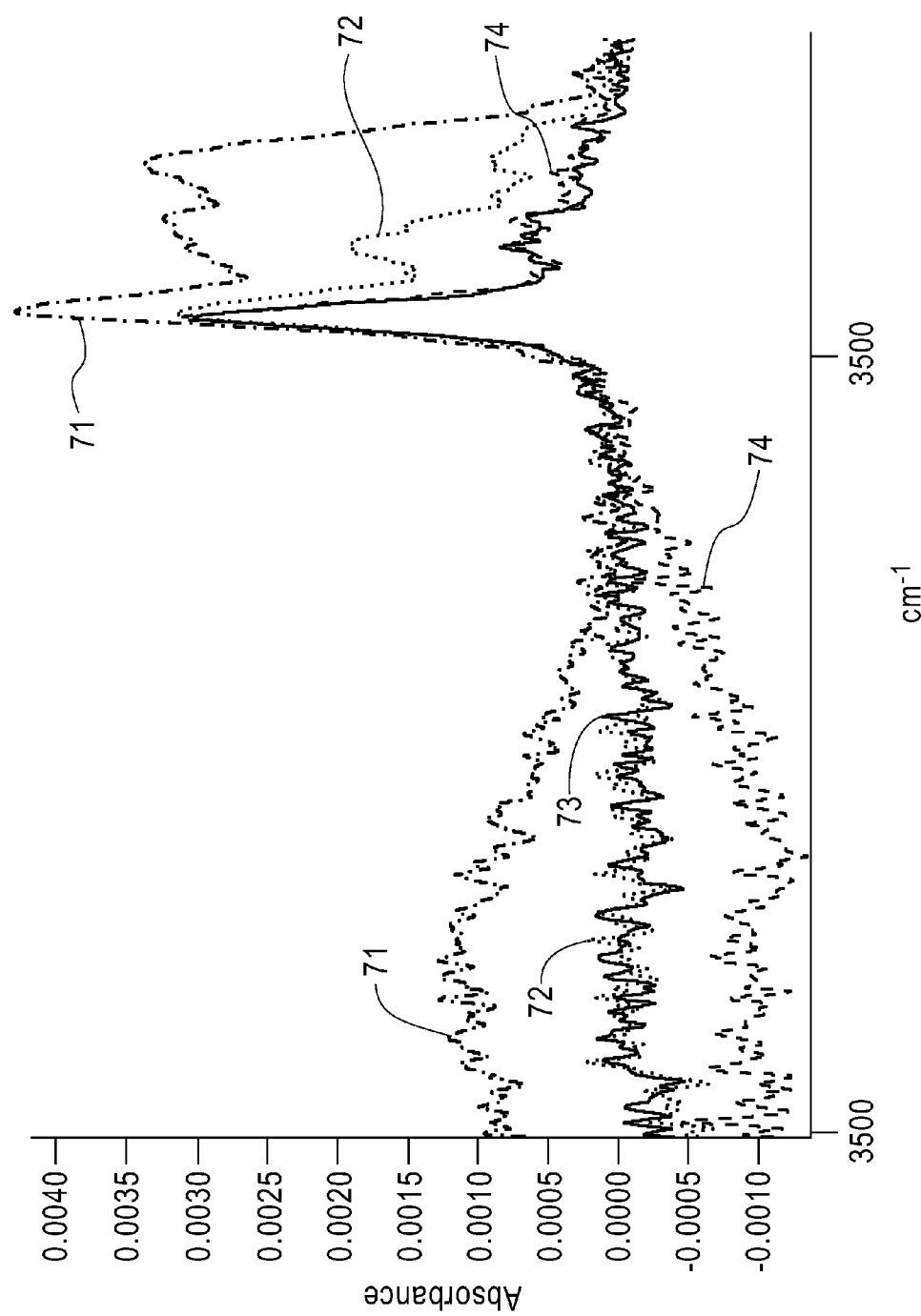
FIG. 8 shows the FTIR spectrum of FIG. 7 emphasizing the spectral region from 2800 to 3500 $cm^{-1}$.

The samples used to collect the data shown in FIG. 6 were also studied using Fourier Transform Infrared (FTIR) spectroscopy, and the data are shown in FIGS. 7 and 8. The sample exposed to CMP Process A corresponding to curve 51 (of FIG. 6) and having a dielectric constant equal to 2.9 produced the FTIR spectrum shown as curve 61 in FIG. 7. The IR absorbance peak due to cage Si—O is centered between 1100-1150 $cm^{-1}$ and the absorbance due to network Si—O is centered between 1020-1060 $cm^{-1}$. It was seen that curve 61 (exposed to CMP Process A) had a high ratio of cage Si—O absorbance to network Si—O absorbance. The samples exposed to CMP Process A and then UV exposure (corresponding to curves 52-54 in FIG. 6) and having dielectric constants equal to 2.4, 2.5, and 2.3, respectively, produced the FTIR spectra shown as curves 62, 63 and 64 in FIG. 7. These spectra showed a lower ratio of cage Si—O absorbance to network Si—O absorbance, compared to curve 61. It is well known in the art that a lower cage to network absorbance peak ratio corresponds to a stronger Si—O network. It is clear that the UV exposures had actually improved the bulk Si—O bonding in the film.

FIG. 8 shows the FTIR spectral region from 2800 to 3500 $cm^{-1}$. The sample exposed to CMP Process A corresponding to curve 51 (FIG. 6) and having dielectric constant equal to 2.9 produced the FTIR spectrum shown as curve 71 in FIG. 7. The samples exposed to CMP Process A and then UV exposure (corresponding to curves 52-54 in FIG. 6) and having dielectric constants equal to 2.4, 2.3, and 2.5, respectively, produced the FTIR spectra shown as curves 72, 73 and 74 in FIG. 8. The broad FTIR absorbance due to Si—OH species, from 3100 to 3500 $cm^{-1}$, was very intense in curve 71 (CMP exposure), was reduced in curves 72, 73, and was essentially removed completely in curve 74. The data of FIGS. 7 and 8 show that Si—OH groups in the CMP exposed film (71) were activated by the UV light, and formed more of the network Si—O species (62, 63 and 64).

After UV exposure, the curves 72, 73, and 74 show distinct changes in the C—H stretch absorbance between 2800-3000 cm$^{-1}$ (FIG. 8). These data show that hydrocarbon molecules were adsorbed on the dielectric during CMP exposure (large C—H intensity in curve 71), and the hydrocarbons were partly removed (72) or completely removed (73, 74) by the UV exposure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
    an UV cured porous ultra low k dielectric layer located on a substrate, said UV cured porous ultra low k dielectric layer comprising a bulk portion and a gradient surface layer located within an upper portion of said bulk portion, wherein said bulk portion is non-oxide like and said gradient surface layer is oxide-like;
    at least one conductive feature embedded within said UV cured porous ultra low k dielectric layer and having a top surface that is coplanar with a top surface of said gradient surface layer; and
    a capping layer located directly on an upper exposed surface of said at least one conductive feature and an upper surface of said gradient surface layer, wherein said UV cured porous ultra low k dielectric layer comprises atoms of Si, C, O and H that are covalently bonded in a tri-dimensional network located on a substrate, said UV cured porous ultra low k dielectric layer having a dielectric constant of less than 3.0, nano-sized pores of a diameter between about 0.3 to about 50 nanometers, and wherein said gradient surface layer has a density gradient and a C content gradient that differ from the bulk portion, and said interconnect structure not including a separate hard mask layer on an upper surface of the gradient surface layer.

2. The interconnect structure of claim 1 wherein said gradient surface layer has a lower ratio of cage Si—O bonding to network Si—O bonding, and a thickness from about 1 to about 50 nm, said gradient surface layer having a density of about 1.0 to about 1.5 g/cm$^3$ to a higher density, with about 2.2 g/gm$^3$ being an upper limit, and with the highest density at a top surface of said gradient surface layer, and wherein dielectric material stack exhibits an electrical leakage current density at a field of 1-2 MV/cm of less than about 10E-7 Amp/cm$^2$ which is lower than an non-UV cured porous ultra low k dielectric comprising atoms of Si, C, O and H and a breakdown field of about 5 MV/cm or greater which is higher than an non-UV cured porous ultra low k dielectric comprising atoms of Si, C, O and H.

3. An interconnect structure comprising:
    an UV cured porous ultra low k dielectric layer and a gradient surface layer located within an upper portion said bulk portion, said UV cured porous ultra low k dielectric layer having a dielectric constant of less than 3.0 and a leakage current density that is lower than that measured without an UV radiation exposure step, and a breakdown field that is higher than that measured without an UV radiation exposure step and wherein said bulk portion is non-oxide like and said gradient surface layer is oxide-like;
    at least one conductive feature embedded within said UV cured porous ultra low k dielectric layer and having a top surface that is coplanar with a top surface of said gradient surface layer; and
    a capping layer located at least on an upper exposed surface of said at least one conductive feature, wherein said gradient surface layer is an oxide-like layer having both a density gradient and a C content gradient that differ from the bulk portion, and said interconnect structure not including a separate hard mask layer on an upper surface of the gradient surface layer.

4. The interconnect structure of claim 3 wherein said substrate comprises a semiconductor substrate, an insulating material, a conductive material or any combination thereof including multilayers.

5. The interconnect structure of claim 3 wherein said UV cured porous ultra low k dielectric layer is a dielectric material comprising atoms of Si, C, O and H that are bonded in a tri-dimensional network structure.

6. The interconnect structure of claim 5 wherein said UV cured porous ultra low k dielectric layer further comprises atoms of F, N or Ge.

7. The interconnect structure of claim 3 wherein said UV cured porous ultra low k dielectric layer has a nanometer-sized pores of between about 0.3 to about 50 nanometers in diameter.

8. The interconnect structure of claim 3 wherein said at least one conductive feature includes at least a conductive material selected from the group consisting of poly Si, a conductive metal, an alloy comprising at least one conductive metal, a conductive metal silicide and combinations thereof.

9. The interconnect structure of claim 8 wherein said at least one conductive feature includes a Cu via and a Cu line.

10. The interconnect structure of claim 3 wherein said gradient surface layer has a density of about 1.0 to about 1.5 g/cm$^3$ to a higher density, with about 2.2 g/cm$^3$ being the upper limit, and with the highest density at the top surface, and contains a C content gradient.

11. The interconnect structure of claim 3 wherein said gradient surface layer has a thickness from about 1 to about 50 nm.

12. The interconnect structure of claim 3 wherein said UV cured porous ultra low k dielectric layer has an electrical leakage current density at a field of 1-2 MV/cm of less than about 10E-7 Amp/cm$^2$ and a breakdown field of about 5 MV/cm or greater.

13. The interconnect structure of claim 3 wherein said gradient surface layer has a lower ratio of cage Si—O bonding to network Si—O bonding, and a thickness from about 1 to about 50 nm, said gradient surface layer having a density of about 1.0 to about 1.5 g/cm$^3$ to a higher density, with about 2.2 g/gm$^3$ being an upper limit, and with the highest density at a top surface of said gradient surface layer, and wherein dielectric material stack exhibits an electrical leakage current density at a field of 1-2 MV/cm of less than about 10E-7 Amp/cm$^2$ which is lower than an non-UV cured porous ultra low k dielectric comprising atoms of Si, C, O and H and a breakdown field of about 5 MV/cm or greater which is higher than an non-UV cured porous ultra low k dielectric comprising atoms of Si, C, O and H.

* * * * *